US008642488B2

(12) United States Patent
Liu et al.

(10) Patent No.: US 8,642,488 B2
(45) Date of Patent: Feb. 4, 2014

(54) MULTI-STEP SYSTEM AND METHOD FOR CURING A DIELECTRIC FILM

(75) Inventors: Junjun Liu, Austin, TX (US); Eric M. Lee, Austin, TX (US); Dorel L. Toma, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 61 days.

(21) Appl. No.: 12/605,863

(22) Filed: Oct. 26, 2009

(65) Prior Publication Data
US 2010/0041248 A1 Feb. 18, 2010

Related U.S. Application Data

(62) Division of application No. 11/269,581, filed on Nov. 9, 2005, now Pat. No. 7,622,378.

(51) Int. Cl.
*H01L 21/26* (2006.01)

(52) U.S. Cl.
USPC ..... 438/795; 438/758; 438/759; 257/E21.328

(58) Field of Classification Search
USPC .......................................... 438/758, 759, 795
See application file for complete search history.

(56) References Cited

U.S. PATENT DOCUMENTS

| | | | |
|---|---|---|---|
| 5,705,232 A * | 1/1998 | Hwang et al. ................. | 427/512 |
| 6,303,524 B1 | 10/2001 | Sharangpani et al. | |
| 6,596,467 B2 | 7/2003 | Gallagher et al. | |
| 6,692,903 B2 | 2/2004 | Chen et al. | |
| 6,756,085 B2 | 6/2004 | Waldfried et al. | |
| 6,764,718 B2 | 7/2004 | Nakamura et al. | |
| 7,030,468 B2 | 4/2006 | Gates et al. | |
| 7,081,638 B1 | 7/2006 | Augur | |
| 7,098,149 B2 | 8/2006 | Lukas et al. | |
| 7,166,531 B1 | 1/2007 | Van Den Hoek et al. | |
| 7,166,963 B2 | 1/2007 | Janos et al. | |
| 7,223,670 B2 | 5/2007 | Callegari et al. | |
| 7,282,458 B2 | 10/2007 | Gates et al. | |
| 7,404,990 B2 | 7/2008 | Lukas et al. | |
| 2002/0092472 A1 | 7/2002 | Hayashi et al. | |
| 2003/0054115 A1 | 3/2003 | Albano et al. | |
| 2003/0224544 A1 | 12/2003 | Prisco et al. | |
| 2004/0018319 A1 | 1/2004 | Waldfried et al. | |

(Continued)

FOREIGN PATENT DOCUMENTS

| | | |
|---|---|---|
| CN | 1257610 A | 6/2000 |
| JP | 64-87780 | 3/1989 |

(Continued)

OTHER PUBLICATIONS

Office Action issued Sep. 10, 2010, in Chinese Patent Application No. 200680050790.8 (with English translation).

(Continued)

*Primary Examiner* — Alexander Ghyka
(74) *Attorney, Agent, or Firm* — Oblon, Spivak, McClelland, Maier & Neustadt, L.L.P.

(57) ABSTRACT

A multi-step system and method for curing a dielectric film in which the system includes a drying system configured to reduce the amount of contaminants, such as moisture, in the dielectric film. The system further includes a curing system coupled to the drying system, and configured to treat the dielectric film with ultraviolet (UV) radiation and infrared (IR) radiation in order to cure the dielectric film.

18 Claims, 5 Drawing Sheets

(56) References Cited

U.S. PATENT DOCUMENTS

| | | |
|---|---|---|
| 2004/0096593 A1 | 5/2004 | Lukas et al. |
| 2004/0096672 A1 | 5/2004 | Lukas et al. |
| 2004/0166628 A1 | 8/2004 | Park et al. |
| 2004/0175501 A1 | 9/2004 | Lukas et al. |
| 2004/0175957 A1 | 9/2004 | Lukas et al. |
| 2005/0064726 A1 | 3/2005 | Reid et al. |
| 2005/0085094 A1 | 4/2005 | Yoo ............................ 438/770 |
| 2005/0272220 A1 | 12/2005 | Waldfried et al. |
| 2006/0024976 A1* | 2/2006 | Waldfried et al. ............ 438/778 |
| 2006/0141806 A1 | 6/2006 | Waldfried et al. |
| 2006/0165904 A1 | 7/2006 | Ohara |
| 2006/0183345 A1 | 8/2006 | Nguyen et al. |
| 2006/0202311 A1 | 9/2006 | Nguyen et al. |
| 2006/0249078 A1 | 11/2006 | Nowak et al. ................. 118/724 |
| 2006/0251827 A1 | 11/2006 | Nowak et al. |
| 2006/0274405 A1 | 12/2006 | Waldfried et al. |
| 2007/0105401 A1 | 5/2007 | Liu et al. |
| 2007/0161230 A1 | 7/2007 | Chen et al. |
| 2007/0228289 A1 | 10/2007 | Kaszuba et al. |
| 2007/0228618 A1 | 10/2007 | Kaszuba et al. |
| 2007/0257205 A1 | 11/2007 | Rocha-Alvarez et al. |
| 2007/0264786 A1 | 11/2007 | Chen et al. |
| 2007/0284698 A1 | 12/2007 | Callegari et al. |
| 2007/0286963 A1 | 12/2007 | Rocha-Alvarez et al. |
| 2008/0063809 A1 | 3/2008 | Lee et al. ....................... 427/558 |
| 2009/0075491 A1 | 3/2009 | Liu et al. |
| 2009/0226694 A1 | 9/2009 | Liu et al. |
| 2009/0226695 A1 | 9/2009 | Liu et al. |
| 2009/0227118 A1 | 9/2009 | Liu et al. |
| 2009/0227119 A1 | 9/2009 | Liu et al. |

FOREIGN PATENT DOCUMENTS

| | | |
|---|---|---|
| JP | 1-309335 | 12/1989 |
| JP | 7-122622 | 5/1995 |
| JP | 10-279362 | 10/1998 |
| JP | 2001-104776 | 4/2001 |
| JP | 2003-151969 | 5/2003 |
| JP | 2003-338499 | 11/2003 |
| JP | 2004-14686 | 1/2004 |
| JP | 2004-146449 | 5/2004 |
| WO | WO 98/43294 | 10/1998 |

OTHER PUBLICATIONS

Taiwanese Office Action issued Jan. 14, 2011, in Patent Application No. 095141315 (with English-language translation).

Willi Volksen, et al., "Laser Spike Annealing: A Novel Post-Porosity Treatment for Significant Toughening of Low-k Organosilicates", IEEE, 2006, pp. 146-148.

Thomas Abell, et al., "Solid state MAS NMR spectroscopic characterization of plasma damage and UV modification of low k dielectric films", Mater. Res. Soc. Symp. Proc., vol. 863, Materials Research Society, 2005, pp. B1.8.1-B1.8.6.

Office Action issued May 31, 2011, in Taiwanese Patent Application No. 095141315 with English translation.

Office Action issued Jul. 23, 2012 in Chinese Patent Application No. 200680050790.8 (with English-language translation).

Office Action issued Jan. 17, 2012, in Japanese Patent Application No. 2008-540027 with English translation.

Chinese Office Action issued Dec. 21, 2011 in patent application No. 200680050790.8 with English translation.

Office Action issued Oct. 12, 2012, in Korean Patent Application No. 10-2008-7013821 with English translation.

JP Office Action mailed Apr. 30, 2013 in JP Patent Application 2008-540027 filed May 8, 2008 (Patent Appeal No. 2013-4677) (with English Summary of JPO Office Action).

Office Action issued Sep. 18, 2012 in Japanese Application No. 2008-540027 (With English Translation).

Office Action issued Aug. 23, 2011 in Taiwanese Patent Application No. 095141315 (with English translation).

\* cited by examiner

MULTI-STEP SYSTEM AND METHOD FOR CURING A DIELECTRIC FILM

CROSS-REFERENCE TO RELATED CASE

This application is a divisional and claims the benefit of priority from U.S. application Ser. No. 11/269,581, filed Nov. 9, 2005, the entire contents of which are incorporated herein by reference.

BACKGROUND OF THE INVENTION

1. Field of the Invention

The present invention relates to a multi-step system and method for treating a dielectric film and, more particularly, to an in-situ, multi-step system and method for drying and curing a dielectric film.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials as the insulating dielectric for metal wires in the IC devices. Thus, in recent years, low-k materials have been developed to replace relatively high dielectric constant insulating materials, such as silicon dioxide. In particular, low-k films are being utilized for inter-level and intra-level dielectric layers between metal wires in semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

Low-k materials are less robust than more traditional silicon dioxide, and the mechanical strength deteriorates further with the introduction of porosity. The porous low-k films can easily be damaged during plasma processing, thereby making desirable a mechanical strengthening process. It has been understood that enhancement of the material strength of porous low-k dielectrics is essential for their successful integration. Aimed at mechanical strengthening, alternative curing techniques are being explored to make porous low-k films more robust and suitable for integration.

The curing of a polymer includes a process whereby a thin film deposited for example using spin-on or vapor deposition (such as chemical vapor deposition CVD) techniques, is treated in order to cause cross-linking within the film. During the curing process, free radical polymerization is understood to be the primary route for cross-linking. As polymer chains cross-link, mechanical properties, such as for example the Young's modulus, the film hardness, the fracture toughness and the interfacial adhesion, are improved, thereby improving the fabrication robustness of the low-k film.

As there are various strategies to forming porous dielectric films with ultra low dielectric constant, the objectives of post-deposition treatments (curing) may vary from film to film, including for example the removal of moisture, the removal of solvents, the burn-out of porogens used to form the pores in the porous dielectric film, the improvement of the mechanical properties for such films, and so on.

Low dielectric constant (low k) materials are conventionally thermally cured at a temperature in the range of 300° C. to 400° C. for CVD films. For instance, furnace curing has been sufficient in producing strong, dense low-k films with a dielectric constant greater than approximately 2.5. However, when processing porous dielectric films (such as ultra low-k films) with a high level of porosity, the degree of cross-linking achievable with thermal treatment (or thermal curing) is no longer sufficient to produce films of adequate strength for a robust interconnect structure.

During thermal curing, it has been noticed that the appropriate amount of energy is delivered to the film without damaging the dielectric film. Within the temperature range of interest, however, only a small amount of free radicals can be generated. Due to the thermal energy lost in the coupling of heat to the substrate and the heat loss in the ambient environment, only a small amount of thermal energy can actually be absorbed in the low-k films to be cured. Therefore, high temperatures and long curing times are required for typical low-k furnace curing. But even with a high thermal budget, the lack of initiator generation in the thermal curing and the presence of a large amount of methyl termination in the as-deposited low-k film can make it very difficult to achieve the desired degree of cross-linking.

SUMMARY OF THE INVENTION

One aspect of the present invention permits reduction or elimination of any of the above-described problems or other problems in the prior art relating to processing dielectric films.

Another aspect of the present invention permits treatment of a dielectric film in order to cure the dielectric film.

Yet another aspect of the present invention permits treatment of a dielectric film by performing an in-situ, multi-step drying and curing process using multiple process modules coupled to one another.

Any of these and/or other aspects may be provided by a processing system for treating a dielectric film in accordance with the present invention. In one embodiment, the processing system for treating a dielectric film on a substrate includes a drying system configured to perform a drying process to reduce the amount of contaminants in or on the dielectric film and a curing system coupled to the drying system and configured to perform a curing process. The curing system includes: an ultraviolet (UV) radiation source configured to expose the dielectric film to UV radiation, and an infrared (IR) radiation source configured to expose the dielectric film to IR radiation. The system includes a transfer system coupled to the drying system and the curing system. The transfer system is configured to exchange the substrate between the drying system and the curing system under vacuum conditions.

In another embodiment, a method and computer readable medium for treating a dielectric film on a substrate includes: disposing the substrate in a drying system, drying the dielectric film according to a drying process in order to remove or partially remove contaminants on or in the dielectric film, transferring the substrate from the drying system to a curing system while maintaining vacuum conditions during the transfer, and curing the dielectric film by, exposing the dielectric film to UV radiation and exposing the dielectric film to IR radiation.

DETAILED DESCRIPTION OF EXEMPLARY EMBODIMENTS

In the following description, in order to facilitate a thorough understanding of the invention and for purposes of explanation and not limitation, specific details are set forth, such as a particular geometry of the processing system and descriptions of various components. However, it should be understood that the invention may be practiced in other embodiments that depart from these specific details.

The inventors recognized that alternative curing methods address some of the deficiencies of thermal curing. For instance, alternative curing methods are more efficient in energy transfer, as compared to thermal curing processes, and the higher energy levels found in the form of energetic particles, such as accelerated electrons, ions, or neutrals, or in the form of energetic photons, can easily excite electrons in a low-k film, thus efficiently breaking chemical bonds and dissociating side groups. These alternative curing methods facilitate the generation of cross-linking initiators (free radicals) and can improve the energy transfer required in actual cross-linking. As a result, the degree of cross-linking can be increased at a reduced thermal budget.

Additionally, the inventors have realized that, as film strength becomes a greater issue for the integration of ultra low-k (ULK) dielectric films (dielectric constant less than approximately 2.5), alternative curing methods can improve the mechanical properties of such films. For example, electron beam (EB), ultraviolet (UV) radiation, infrared (IR) radiation and microwave (MW) radiation may be used to cure ULK films in order to improve mechanical strength, while not sacrificing the dielectric property and film hydrophobicity.

However, although EB, UV, IR and MW curing all have their own benefits, these techniques also have limitations. High energy curing sources such as EB and UV can provide high energy levels to generate more than enough free radicals for cross-linking, which leads to much improved mechanical properties under complementary substrate heating. On the other hand, electrons and UV photons can cause indiscriminate dissociation of chemical bonds, which may adversely degrade the desired physical and electrical properties of the film, such as loss of hydrophobicity, increased residual film stress, collapse of pore structure, film densification and increased dielectric constant. Furthermore, low energy curing sources, such as IR and MW curing, can provide significant improvements mostly in the heat transfer efficiency, but in the meantime have side effects, such as for example skin layer or surface densification (IR), and arcing or transistor damage (MW).

Figure 1A:
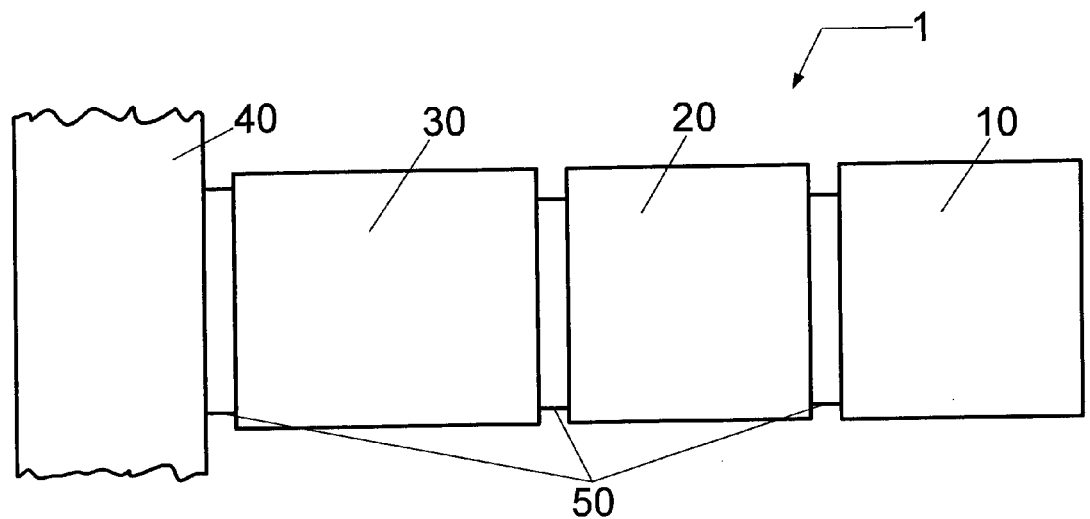
FIGS. 1A through 1C are schematic representations of a transfer system for a drying system and a curing system according to an embodiment of the present invention.

Referring now to the drawings, wherein like reference numerals designate identical or corresponding parts throughout the several views, FIG. 1A shows a processing system 1 for treating a dielectric film on a substrate, according to one embodiment of the present invention. The processing system 1 includes a drying system 10, and a curing system 20 coupled to the drying system 10. For example, the drying system 10 can be configured to remove, or reduce to sufficient levels, one or more contaminants in the dielectric film, including, for example, moisture, solvent, porogen, or any other contaminant that may interfere with a curing process performed in the curing system 20.

For example, a sufficient reduction of a specific contaminant present within the dielectric film, from prior to the drying process to following the drying process, can include a reduction of approximately 10% to approximately 100% of the specific contaminant. The level of contaminant reduction may be measured using Fourier transform infrared (FTIR) spectroscopy, or mass spectroscopy. Alternatively, for example, a sufficient reduction of a specific contaminant present within the dielectric film can range from approximately 50% to approximately 100%. Alternatively, for example, a sufficient reduction of a specific contaminant present within the dielectric film can range from approximately 80% to approximately 100%.

Referring still to FIG. 1A, the curing system 20 can be configured to cure the dielectric film by causing or partially causing cross-linking within the dielectric film in order to, for example, improve the mechanical properties of the dielectric film. The curing system 20 can include two or more radiation sources configured to expose the substrate having the dielectric film to electromagnetic (EM) radiation at multiple EM wavelengths. For example, the two or more radiation sources can include an infrared (IR) radiation source and an ultraviolet (UV) radiation source. The exposure of the substrate to UV radiation and IR radiation can be performed simultaneously, sequentially, or over-lapping one another. During sequential exposure, the exposure of the substrate to UV radiation can, for instance, precede the exposure of the substrate to IR radiation or vice versa.

For example, the IR radiation can include an IR wave-band source ranging from approximately 1 micron to approximately 25 microns and, desirably, ranging from approximately 8 microns to approximately 14 microns. Additionally, for example, the UV radiation can include a UV wave-band source producing radiation ranging from approximately 100 nanometers (nm) to approximately 600 nm and, desirably, ranging from approximately 200 nm to approximately 400 nm.

The inventors have recognized that the energy level (hv) and the rate that energy is delivered to the dielectric film (q') varies during different stages of the curing process. The curing process can include mechanisms for generation of cross-link initiators, burn-out of porogens, decomposition of porogens, film cross-linking, and optionally cross-link initiator diffusion. Each mechanism may require a different energy level and rate at which energy is delivered to the dielectric film. For instance, during the curing of the matrix material, cross-link initiators may be generated using photon and phonon induced bond dissociation within the matrix material. Bond dissociation can require energy levels having a wavelength less than or equal to approximately 300 to 400 nm. Additionally, for instance, porogen burn-out may be facilitated with photon absorption by the photosensitizer. Porogen burn-out may require UV wavelengths, such as wavelengths less than or equal to approximately 300 to 400 nm. Further yet, for instance, cross-linking can be facilitated by thermal energy sufficient for bond formation and reorganization. Bond formation and reorganization may require energy levels having a wavelength of approximately 9 microns which, for example, corresponds to the main absorbance peak in siloxane-based organosilicate low-k materials.

The substrate, to be treated, may be a semiconductor, a metallic conductor, or any other substrate to which the dielectric film is to be formed upon. The dielectric film can have a dielectric constant value (before drying and/or curing, or after drying and/or curing, or both) less than the dielectric constant of $SiO_2$, which is approximately 4 (e.g., the dielectric constant for thermal silicon dioxide can range from 3.8 to 3.9). In various embodiments of the invention, the dielectric film may have a dielectric constant (before drying and/or curing, or after drying and/or curing, or both) of less than 3.0, a dielectric constant of less than 2.5, or a dielectric constant ranging from 1.6 to 2.7. The dielectric film may be described as a low-k film or an ultra low-k film. The dielectric film may, for instance, include a dual phase porous low-k film which may have a higher dielectric constant prior to porogen burn-out than following porogen burn-out. Additionally, the dielectric film may have moisture and/or other contaminants which cause the dielectric constant to be higher prior to drying and/or curing than following drying and/or curing.

The dielectric film can be formed using chemical vapor deposition (CVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate as known to those skilled in the art of both spin-on dielectric technology and CVD dielectric technology are suitable for the invention.

The dielectric film can, for example, be characterized as a low dielectric constant (or low-k) dielectric film. The dielectric film may include at least one of an organic, inorganic, and inorganic-organic hybrid material. Additionally, the dielectric film may be porous or non-porous. For example, the dielectric film may include an inorganic, silicate-based material, such as oxidized organosilane (or organo siloxane), deposited using CVD techniques. Examples of such films include Black Diamond™ CVD organosilicate glass (OSG) films commercially available from Applied Materials, Inc., or Coral™ CVD films commercially available from Novellus Systems. Additionally, for example, porous dielectric films can include single-phase materials, such as a silicon oxide-based matrix having terminal organic side groups that inhibit cross-linking during a curing process to create small voids (or pores). Additionally, for example, porous dielectric films can include dual-phase materials, such as a silicon oxide-based matrix having inclusions of organic material (e.g., a porogen) that is decomposed and evaporated during a curing process. Alternatively, the dielectric film may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the dielectric film can include an organic material deposited using SOD techniques. Examples of such films include SiLK-I, SiLK-J, SiLK-H, SiLK-D, porous SiLK-T, porous SiLK-Y, and porous SiLK-Z semiconductor dielectric resins commercially available from Dow Chemical, and FLARE™, and Nano-glass commercially available from Honeywell.

Also, as illustrated in FIG. 1A, a transfer system 30 can be coupled to the drying system 10 in order to transfer substrates into and out of the drying system 10 and the curing system 20, and exchange substrates with a multi-element manufacturing system 40. Transfer system 30 may transfer substrates to and from drying system 10 and curing system 20 while maintaining a vacuum environment. The drying and curing systems 10, 20, and the transfer system 30 can, for example, include a processing element within the multi-element manufacturing system 40. For example, the multi-element manufacturing system 40 can permit the transfer of substrates to and from processing elements including such devices as etch systems, deposition systems, coating systems, patterning systems, metrology systems, etc. In order to isolate the processes occurring in the first and second systems, an isolation assembly 50 can be utilized to couple each system. For instance, the isolation assembly 50 can include at least one of a thermal insulation assembly to provide thermal isolation, and a gate valve assembly to provide vacuum isolation. The drying and curing systems 10 and 20, and transfer system 30 can be placed in any sequence.

Figure 1B:
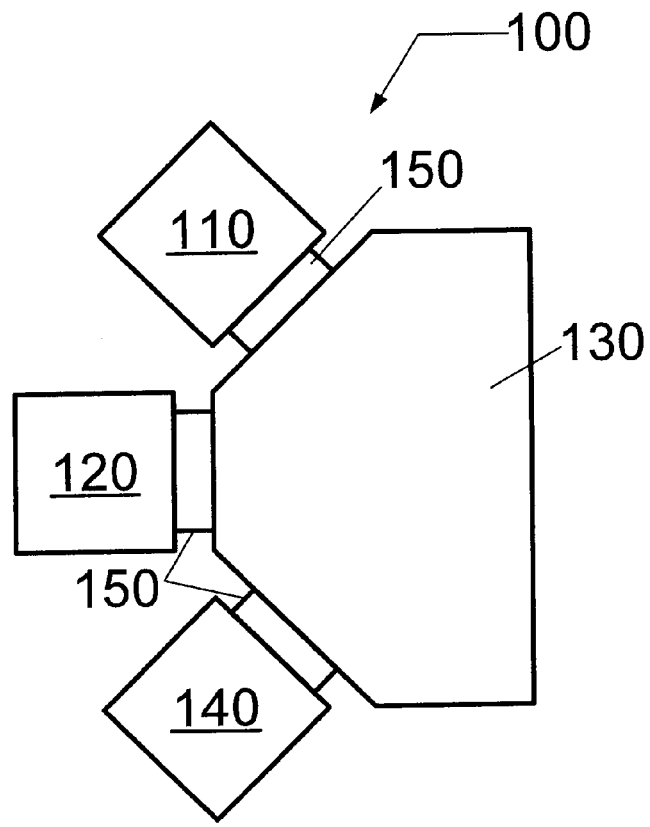

Alternately, in another embodiment of the invention, FIG. 1B shows a processing system 100 for treating a dielectric film on a substrate. The processing system 100 includes a "cluster-tool" arrangement for a drying system 110, and a curing system 120. For example, the drying system 110 can be configured to remove, or reduce to sufficient levels, one or more contaminants in the dielectric film, including, for example, moisture, solvent, porogen, or any other contaminant that may interfere with a curing process performed in the curing system 120. Additionally, for example, the curing system 120 can be configured to cure the dielectric film by causing or partially causing cross-linking within the dielectric film in order to, for example, improve the mechanical properties of the dielectric film. Furthermore, the processing system 100 can optionally include a post-treatment system 140 configured to modify the cured dielectric film. For example, post-treatment can include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions.

Also, as illustrated in FIG. 1B, a transfer system 130 can be coupled to the drying system 110 in order to transfer substrates into and out of the drying system 110, and can be coupled to the curing system 120 in order to transfer substrates into and out of the curing system 120, and can be coupled to the optional post-treatment system 140 in order to transfer substrates into and out of the post-treatment system 140. Transfer system 130 may transfer substrates to and from drying system 110, curing system 120 and optional post-treatment system 140 while maintaining a vacuum environment.

Additionally, transfer system 130 can exchange substrates with one or more substrate cassettes (not shown). Although only two or three process systems are illustrated in FIG. 1B, other process systems can access transfer system 130 including for example such devices as etch systems, deposition systems, coating systems, patterning systems, metrology systems, etc. In order to isolate the processes occurring in the drying and curing systems, an isolation assembly 150 can be utilized to couple each system. For instance, the isolation assembly 150 can include at least one of a thermal insulation assembly to provide thermal isolation, and a gate valve assembly to provide vacuum isolation. Additionally, for example, the transfer system 130 can serve as part of the isolation assembly 150.

Figure 1C:
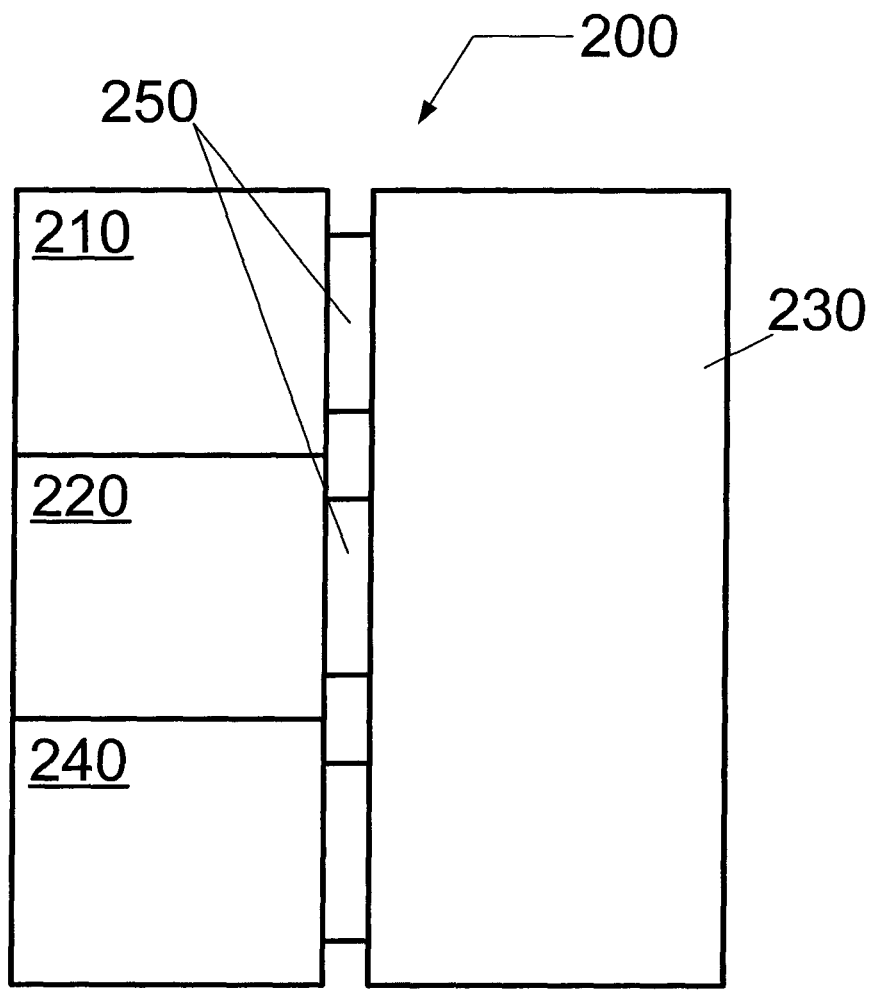

Alternatively, in another embodiment of the invention, FIG. 1C shows a processing system 200 for treating a dielectric film on a substrate. The processing system 200 includes a drying system 210, and a curing system 220. For example, the drying system 210 can be configured to remove, or reduce to sufficient levels, one or more contaminants in the dielectric film, including, for example, moisture, solvent, porogen, or any other contaminant that may interfere with a curing process performed in the curing system 220. Additionally, for example, the curing system 220 can be configured to cure the dielectric film by causing or partially causing cross-linking within the dielectric film in order to, for example, improve the mechanical properties of the dielectric film. Furthermore, the processing system 200 can optionally include a post-treatment system 240 configured to modify the cured dielectric film. For example, post-treatment can include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions.

Drying system 210, curing system 220, and post-treatment system 240 can be arranged horizontally or may be arranged vertically (i.e., stacked). Also, as illustrated in FIG. 1C, a transfer system 230 can be coupled to the drying system 210 in order to transfer substrates into and out of the drying system 210, can be coupled to the curing system 220 in order to transfer substrates into and out of the curing system 220, and can be coupled to the optional post-treatment system 240 in order to transfer substrates into and out of the post-treatment system 240. Transfer system 230 may transfer substrates to and from drying system 210, curing system 220 and optional post-treatment system 240 while maintaining a vacuum environment.

Additionally, transfer system 230 can exchange substrates with one or more substrate cassettes (not shown). Although only three process systems are illustrated in FIG. 1C, other process systems can access transfer system 230 including for example such devices as etch systems, deposition systems, coating systems, patterning systems, metrology systems, etc. In order to isolate the processes occurring in the first and second systems, an isolation assembly 250 can be utilized to couple each system. For instance, the isolation assembly 250 can include at least one of a thermal insulation assembly to provide thermal isolation, and a gate valve assembly to provide vacuum isolation. Additionally, for example, the transfer system 230 can serve as part of the isolation assembly 250.

At least one of the drying system 10 and the curing system 20 of the processing system 1 as depicted in FIG. 1A includes at least two transfer openings to permit the passage of the substrate therethrough. For example, as depicted in FIG. 1A, the drying system 10 includes two transfer openings, the first transfer opening permits the passage of the substrate between the drying system 10 and the transfer system 30 and the second transfer opening permits the passage of the substrate between the drying system and the curing system. However, regarding the processing system 100 depicted in FIG. 1B and the processing system 200 depicted in FIG. 1C, each treatment system 110, 120, 140 and 210, 220, 240, respectively, includes at least one transfer opening to permit the passage of the substrate therethrough.

Figure 2:
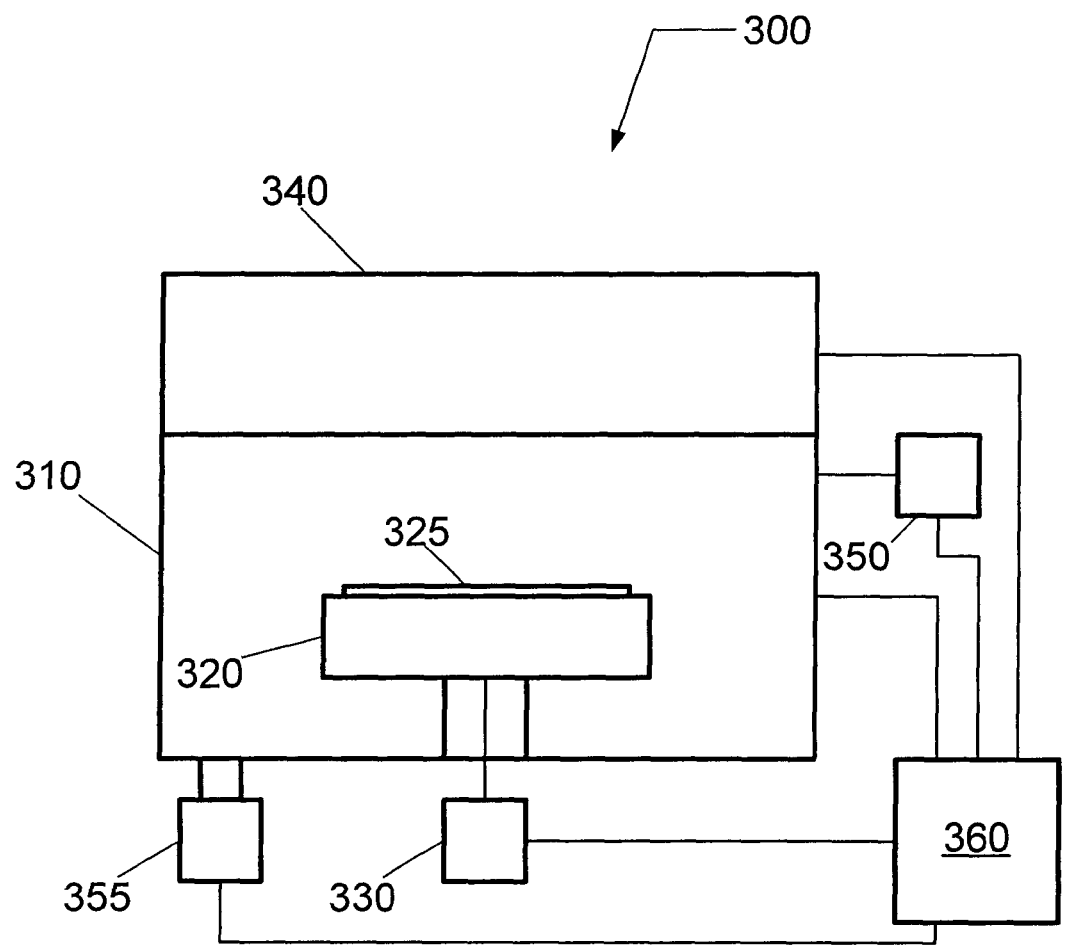
FIG. 2 is a schematic cross-sectional view of a drying system according to another embodiment of the present invention.

Referring now to FIG. 2, a drying system 300 is shown according to another embodiment of the invention. Drying system 300 includes a drying chamber 310 configured to produce a clean, contaminant-free environment for drying a substrate 325 resting on substrate holder 320. The drying system 300 can include a thermal treatment device 330 coupled to drying chamber 310, or to substrate holder 320, and configured to evaporate contaminants, such as for example moisture, residual solvent, etc., by elevating the temperature of substrate 325. Furthermore, the drying system 300 can include a microwave treatment device 340 coupled to the drying chamber 310, and configured to locally heat contaminants in the presence of an oscillating electric field. The drying process can utilize the thermal treatment device 330, or the microwave treatment device 340, or both to facilitate drying a dielectric film on substrate 325.

The thermal treatment device 330 can include one or more conductive heating elements embedded in substrate holder 320 coupled to a power source and a temperature controller. For example, each heating element can include a resistive heating element coupled to a power source configured to supply electrical power. Alternatively, the thermal treatment device 330 can include one or more radiative heating elements coupled to a power source and a controller. For example, each radiative heating element can include a heat lamp coupled to a power source configured to supply electrical power. The temperature of substrate 325 can, for example, range from approximately 20° C. to approximately 500° C., and desirably, the temperature may range from approximately 200° C. to approximately 400° C.

The microwave treatment source 340 can include a variable frequency microwave source configured to sweep the microwave frequency through a bandwidth of frequencies. Frequency variation avoids charge build-up and, hence, permits damage-free application of microwave drying techniques to sensitive electronic devices.

In one example, the drying system 300 can include a drying system incorporating both a variable frequency microwave device and a thermal treatment device, such as for example the microwave furnace commercially available from Lambda Technologies, Inc. (860 Aviation Parkway, Suite 900, Morrisville, N.C. 27560). For additional details, a microwave furnace is described in U.S. Pat. No. 5,738,915, assigned to Lambda Technologies, Inc., and entitled "Curing polymer layers on semiconductor substrates using variable frequency microwave energy"; the entire contents of which are incorporated herein by reference.

The substrate holder 320 may or may not be configured to clamp substrate 325. For instance, substrate holder 320 may be configured to mechanically or electrically clamp substrate 325.

Referring again to FIG. 2, drying system 300 can further include a gas injection system 350 coupled to the drying chamber and configured to introduce a purge gas to drying chamber 310. The purge gas can, for example, include an inert gas, such as a noble gas or nitrogen. Additionally, drying system 300 can include a vacuum pumping system 355 coupled to drying chamber 310 and configured to evacuate the drying chamber 310. During a drying process, substrate 325 can be subject to an inert gas environment with or without vacuum conditions.

Furthermore, drying system 300 can include a controller 360 coupled to drying chamber 310, substrate holder 320, thermal treatment device 330, microwave treatment device 340, gas injection system 350, and vacuum pumping system 355. Controller 360 includes a microprocessor, a memory, and a digital I/O port capable of generating control voltages sufficient to communicate and activate inputs to the drying system 300 as well as monitor outputs from the drying system 300. A program stored in the memory is utilized to interact with the drying system 300 according to a stored process recipe. The controller 360 can be used to configure any number of processing elements (310, 320, 330, 340, 350, or 355), and the controller 360 can collect, provide, process, store, and display data from processing elements. The controller 360 can include a number of applications for controlling one or more of the processing elements. For example, controller 360 can include a graphic user interface (GUI) component (not shown) that can provide interfaces that enable a user to monitor and/or control one or more processing elements.

Figure 3:
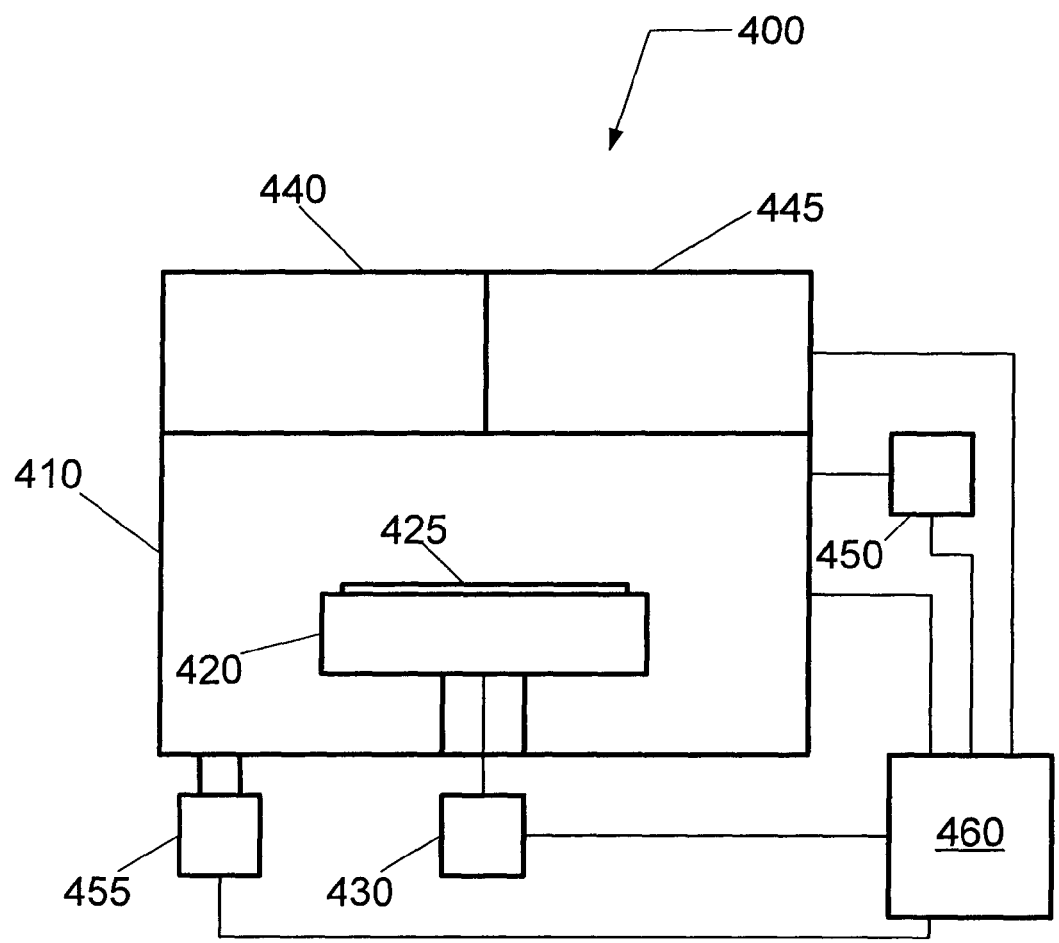
FIG. 3 is a schematic cross-sectional view of a curing system according to another embodiment of the present invention.

Referring now to FIG. 3, a curing system 400 is shown according to another embodiment of the present invention. Curing system 400 includes a curing chamber 410 configured to produce a clean, contaminant-free environment for curing a substrate 425 resting on substrate holder 420. Curing system 400 further includes two or more radiation sources configured to expose substrate 425 having the dielectric film to electromagnetic (EM) radiation at multiple EM wavelengths. The two or more radiation sources can include an infrared (IR) radiation source 440 and an ultraviolet (UV) radiation source 445. The exposure of the substrate to UV radiation and IR radiation can be performed simultaneously, sequentially, or over-lapping one another.

The IR radiation source 440 may include a broad-band IR source, or may include a narrow-band IR source. The IR radiation source can include one or more IR lamps, or one or more IR lasers (continuous wave (CW), tunable, or pulsed), or any combination thereof. The IR power can range from approximately 0.1 mW to approximately 2000 W. The IR radiation wavelength can range from approximately 1 micron to approximately 25 microns and, desirably, can range from approximately 8 microns to approximately 14 microns. For example, the IR radiation source 440 can include an IR element, such as a ceramic element or silicon carbide element, having a spectral output ranging from approximately 1 micron to approximately 25 microns, or the IR radiation source 440 can include a semiconductor laser (diode), or ion, Ti:sapphire, or dye laser with optical parametric amplification.

The UV radiation source 445 may include a broad-band UV source, or may include a narrow-band UV source. The UV radiation source can include one or more UV lamps, or one or more UV lasers (continuous wave (CW), tunable, or pulsed), or any combination thereof. UV radiation can be generated, for instance, from a microwave source, an arc discharge, a dielectric barrier discharge, or electron impact generation. The UV power density can range from approximately 0.1 mW/cm$^2$ to approximately 2000 mW/cm$^2$. The UV wavelength can range from approximately 100 nanometers (nm) to approximately 600 nm and, desirably, can range from approximately 200 nm to approximately 400 nm. For example, the UV radiation source 445 can include a direct current (DC) or pulsed lamp, such as a Deuterium ($D_2$) lamp, having a spectral output ranging from approximately 180 nm to approximately 500 nm, or the UV radiation source 445 can include a semiconductor laser (diode), (nitrogen) gas laser, frequency-tripled Nd:YAG laser, or copper vapor laser.

The IR radiation source 440, or the UV radiation source 445, or both, may include any number of optical device to adjust one or more properties of the output radiation. For example, each source may further include optical filters, optical lenses, beam expanders, beam collimators, etc. Such optical manipulation devices as known to those skilled in the art of optics and EM wave propagation are suitable for the invention.

The substrate holder 420 can further include a temperature control system that can be configured to elevate and/or control the temperature of substrate 425. The temperature control system can be a part of a thermal treatment device 430. The substrate holder 420 can include one or more conductive heating elements embedded in substrate holder 420 coupled to a power source and a temperature controller. For example, each heating element can include a resistive heating element coupled to a power source configured to supply electrical power. The substrate holder 420 could optionally include one or more radiative heating elements. The temperature of substrate 425 can, for example, range from approximately 20° C. to approximately 500° C., and desirably, the temperature may range from approximately 200° C. to approximately 400° C.

Additionally, the substrate holder 420 may or may not be configured to clamp substrate 425. For instance, substrate holder 420 may be configured to mechanically or electrically clamp substrate 425.

Referring again to FIG. 3, curing system 400 can further include a gas injection system 450 coupled to the curing chamber 410 and configured to introduce a purge gas to curing chamber 410. The purge gas can, for example, include an inert gas, such as a noble gas or nitrogen. Alternatively, the purge gas can include other gases, such as for example $H_2$, $NH_3$, $C_xH_y$, or any combination thereof. Additionally, curing system 400 can further include a vacuum pumping system 455 coupled to curing chamber 410 and configured to evacuate the curing chamber 410. During a curing process, substrate 425 can be subject to a purge gas environment with or without vacuum conditions.

Furthermore, curing system 400 can include a controller 460 coupled to drying chamber 410, substrate holder 420, thermal treatment device 430, IR radiation source 440, UV radiation source 445, gas injection system 450, and vacuum pumping system 455. Controller 460 includes a microprocessor, a memory, and a digital I/O port capable of generating control voltages sufficient to communicate and activate inputs to the curing system 400 as well as monitor outputs from the curing system 400. A program stored in the memory is utilized to interact with the curing system 400 according to a stored process recipe. The controller 460 can be used to configure any number of processing elements (410, 420, 430, 440, 445, 450, or 455), and the controller 460 can collect, provide, process, store, and display data from processing elements. The controller 460 can include a number of applications for controlling one or more of the processing elements. For example, controller 460 can include a graphic user interface (GUI) component (not shown) that can provide easy to use interfaces that enable a user to monitor and/or control one or more processing elements.

The controllers 360 and 460 may be implemented as a DELL PRECISION WORKSTATION 610™. The controllers 360 and 460 may also be implemented as a general purpose computer, processor, digital signal processor, etc., which causes a substrate processing apparatus to perform a portion or all of the processing steps of the invention in response to the controllers 360 and 460 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controllers 360 and 460 may be locally located relative to the drying system 300 and curing system 400, or may be remotely located relative to the drying system 300 and curing system 400 via an internet or intranet. Thus, the controllers 360 and 460 can exchange data with the drying system 300 and curing system 400 using at least one of a direct connection, an intranet, and the internet. The controllers 360 and 460 may be coupled to an intranet at a customer site (i.e., a device maker, etc.), or coupled to an intranet at a vendor site (i.e., an equipment manufacturer). Furthermore, another computer (i.e., controller, server, etc.) can access controllers 360 and 460 to exchange data via at least one of a direct connection, an intranet, and the internet.

Figure 4:
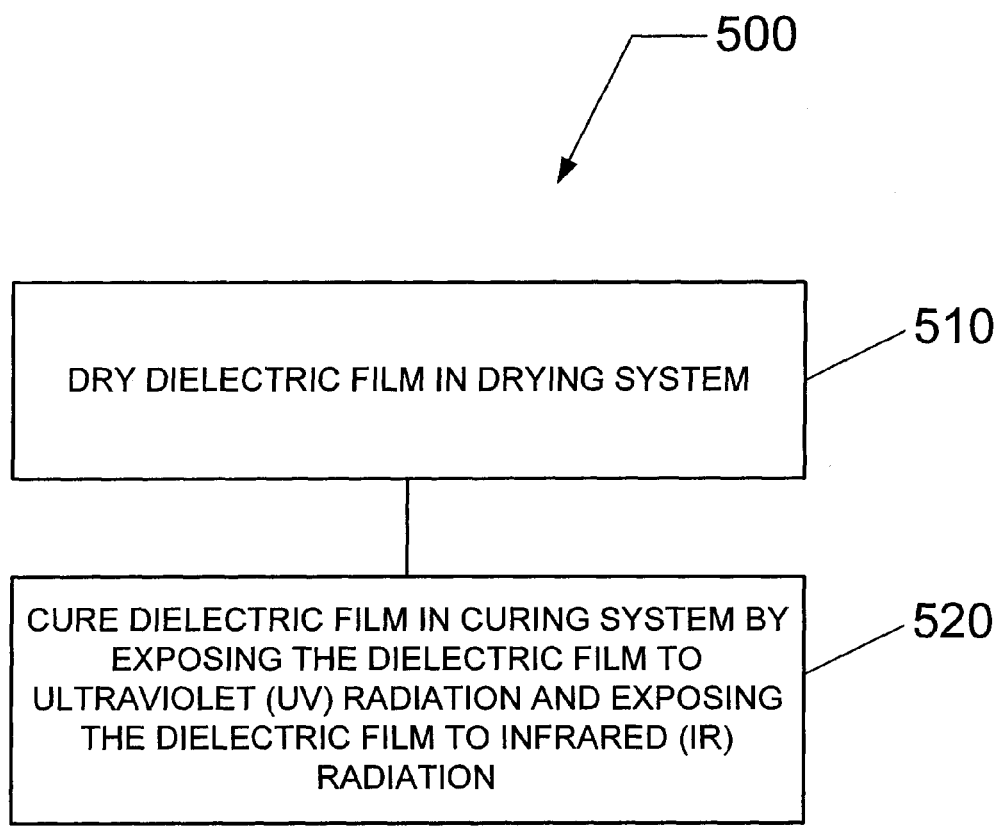
FIG. 4 is a flow chart of a method of treating a dielectric film according to yet another embodiment of the present invention.

Referring now to FIG. 4, a method of treating a dielectric film on a substrate is described according to another embodiment. The method includes a flow chart 500 beginning in 510 with drying the dielectric film on the substrate in a first processing system. The first processing system includes a drying system configured to remove, or partially remove, one or more contaminants in the dielectric film, including, for example, moisture, solvent, porogen, or any other contaminant that may interfere with a subsequent curing process.

In 520, the dielectric film is cured in a second processing system. The second processing system includes a curing system configured to cure the dielectric film by causing or partially causing cross-linking within the dielectric film in order to, for example, improve the mechanical properties of the dielectric film. Following the drying process, the substrate can be transferred from the first process system to the second processing system under vacuum in order to minimize contamination. Therein, the substrate is exposed to UV radiation and IR radiation. Additionally, following the drying and curing processes, the dielectric film may optionally be post-treated in a post-treatment system configured to modify the cured dielectric film. For example, post-treatment can include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions. One such post-treatment that can be suitable for the present invention is described in U.S. Pat. No. 5,714,437, entitled Method of improving adhesion between thin films, the entire contents of which are incorporated herein by reference.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method of treating a dielectric film on a substrate, comprising:
disposing said substrate in a curing system; and
curing said dielectric film by:
exposing said dielectric film to infrared (IR) radiation ranging from approximately 8 microns to approximately 14 microns to facilitate cross-linking by thermal energy sufficient for bond formation and reorganization during one stage of said curing, and
exposing said dielectric film to ultraviolet (UV) radiation ranging from approximately 100nm to approximately 600nm to also perform at least one of generating cross-link initiators by bond dissociation and facilitating porogen burn out during another stage of said curing said dielectric film, wherein at least part of said exposing to IR radiation and said exposing to UV radiation is performed simultaneously.

2. The method of claim 1, wherein said exposing said dielectric film to UV radiation comprises:

exposing said dielectric film to UV radiation from one or more UV lamps, or one or more UV lasers, or both of one or more UV lamps and the one or more UV lasers;
exposing said dielectric film to said UV radiation at an energy level sufficient to generate said cross-link initiators using photon and photon-induced bond dissociation within a matrix material of said dielectric film; and
exposing said dielectric film to said UV radiation at an energy level sufficient to facilitate said porogen burn-out with photon absorption.

3. The method of claim 1, wherein said exposing said dielectric film to IR radiation comprises:
exposing said dielectric film to IR radiation from one or more IR lamps, or one or more IR lasers, or both of the one or more IR lamps and the one or more IR lasers; and
exposing said dielectric film to said IR radiation at an energy level which corresponds to a main absorption peak of the dielectric film.

4. The method of claim 1, further comprising:
treating said dielectric film following said curing by performing one or more of depositing another film on said dielectric film, cleaning said dielectric film, or exposing said dielectric film to a plasma.

5. The method of claim 1, wherein said curing comprises treating a low-k dielectric film.

6. The method of claim 1, wherein said exposing said dielectric film to IR radiation and said exposing said dielectric film to UV radiation are performed simultaneously.

7. The method of claim 1, wherein said exposing said dielectric film to IR radiation and said exposing said dielectric film to UV radiation are performed sequentially.

8. The method of claim 1, wherein said exposing said dielectric film to IR radiation and said exposing said dielectric film to UV radiation are performed overlapping one another.

9. The method of claim 1, wherein said exposing said dielectric film to UV radiation comprises a UV wavelength ranging from about 200 nm to about 400 nm.

10. The method of claim 1, further comprising heating said substrate.

11. The method of claim 10, wherein said heating comprises elevating said substrate to a temperature ranging from about 20 degrees C. to about 500 degrees C.

12. The method of claim 11, wherein said heating comprises elevating said substrate to a temperature ranging from about 200 degrees C. to about 400 degrees C.

13. The method of claim 10, wherein said heating is performed during said exposing said dielectric film to UV radiation.

14. The method of claim 10, wherein said heating is performed during said exposing said dielectric film to IR radiation.

15. The method of claim 10, further comprising controlling a temperature of said substrate.

16. The method of claim 15, further comprising clamping said substrate to a substrate holder during said controlling.

17. The method of claim 1, wherein said dielectric film comprises a porous low dielectric constant (low-k) film.

18. The method of claim 1, further comprising
disposing said substrate in a drying system;
drying said dielectric film according to a drying process in order to remove or partially remove undesired residues or absorbates on or in said dielectric film;
transferring said substrate from said drying system to said curing system while maintaining vacuum conditions during said transfer.

* * * * *